(12) United States Patent
Louis

(10) Patent No.: US 7,947,594 B2
(45) Date of Patent: May 24, 2011

(54) INTERCONNECTION STRUCTURE WITH LOW DIELECTRIC CONSTANT

(75) Inventor: Didier Louis, Coublevie (FR)

(73) Assignee: Commissariat a l'Energie Atomique, Paris (FR)

( * ) Notice: Subject to any disclaimer, the term of this patent is extended or adjusted under 35 U.S.C. 154(b) by 909 days.

(21) Appl. No.: 10/571,936

(22) PCT Filed: Sep. 15, 2004

(86) PCT No.: PCT/FR2004/050435
§ 371 (c)(1),
(2), (4) Date: Dec. 27, 2006

(87) PCT Pub. No.: WO2005/029577
PCT Pub. Date: Mar. 31, 2005

(65) Prior Publication Data
US 2007/0087554 A1 Apr. 19, 2007

(30) Foreign Application Priority Data
Sep. 16, 2003 (FR) .................................... 03 50547

(51) Int. Cl.
*H01L 21/4763* (2006.01)
(52) U.S. Cl. ................. 438/618; 257/666; 257/E21.576
(58) Field of Classification Search .................. 438/618; 257/666, E21.576
See application file for complete search history.

(56) References Cited

U.S. PATENT DOCUMENTS

| 5,559,055 A | 9/1996 | Chang et al. |
| 6,077,774 A | 6/2000 | Hong et al. |
| 6,303,486 B1 | 10/2001 | Park |
| 6,403,461 B1 | 6/2002 | Tae et al. |
| 2001/0036723 A1 | 11/2001 | Torres et al. |
| 2002/0117399 A1 | 8/2002 | Chen et al. |

FOREIGN PATENT DOCUMENTS
DE 101 21 132 10/2002

OTHER PUBLICATIONS

Choi, "Method for forming a anti-diffusion film and copper metal line using the same in semiconductor device", KP 10-2004-0001990.*
Cheng Y.Y. et al., "Ultra-low Dielectric Constant Low Density Material (k=2.2) for Cu Damascene", Research and Development, pp. 161-163, 2000.
Donohue H. et al., "Preparation of Damascene Trench Sidewalls in CVD Nano-Porous Ultra Low K (K=2.2) Films for Compatibility with Mocvd Diffusion Barriers", Advanced Metallization Conference, pp. 1-7, 2002.

* cited by examiner

*Primary Examiner* — Matthew C Landau
*Assistant Examiner* — Sonya D McCall Shepard
(74) *Attorney, Agent, or Firm* — Oblon, Spivak, McClelland, Maier & Neustadt, L.L.P.

(57) ABSTRACT

A method for producing an interconnection structure including at least one insulating layer having a low dielectric constant and at least one metal connection element coated with a support layer and capable of connecting to at least one conductive area of a microelectronic device. The interconnection structure has an improved low dielectric constant. The interconnection structures may be a metal interconnection structure in a variety of integrated circuits.

11 Claims, 5 Drawing Sheets

INTERCONNECTION STRUCTURE WITH LOW DIELECTRIC CONSTANT

TECHNICAL FIELD

This invention relates to the field of interconnections in microelectronic devices or circuits. It relates to an improved interconnection structure, for example, of the damascene and/or low dielectric constant-type, as well as various methods of production.

These structures enable metal lines in microelectronic devices to be interconnected and apply in particular to interconnections using copper as conductive materials.

The term microelectronic device refers to any type of electronic circuit such as a chip, an integrated circuit, an electromechanical microsystem, and so on.

PRIOR ART

The improvement of integrated circuit performances (speed, low consumption) has led to the use of a more conductive metal than aluminium in the production of interconnection structures. Copper, which has a resistivity two times lower than aluminium is a good alternative. As copper cannot be industrially etched, a so-called "damascene" method is used to produce interconnection structures using copper.

This method uses a deposition of at least one insulating layer on a conductive area of a microelectronic device, followed by etching of holes and/or trenches in said insulating layer, then the deposition and polishing of at least one conductive layer, such as copper, in the holes and/or trenches.

To improve the performance of integrated circuits, insulating layers can be produced with dielectric materials having a lower and lower dielectric constant k. The new dielectric materials used are materials commonly called "low-k materials" ("low dielectric constant k materials"). A "low-k" material is defined as a material having a dielectric constant k lower than 4.2, the value corresponding to the dielectric constant of $SiO_2$ deposited by a plasma process. A so-called "high-k" material is a material with a dielectric constant above 4.2.

Materials such as $SiO_2$, USG ("undoped silicon glass") materials and SOG ("spin on glass") silicate or SOG siloxane materials were previously used to form the insulating layer in interconnection structures.

They have gradually been replaced by low dielectric constant k materials having the structure $Si_xOF_y$, called FSG materials (for "fluorinated silicon glass") with a dielectric constant between 3 and 3.5, and hydrogen silsesquioxane (HSQ) or methylsilsesquioxane (MSQ) or phenylsislsesquioxane materials.

As the objective is to be capable of integrating dielectric materials with the lowest possible dielectric constant, it is attempted to approach the dielectric constant of air (equal to 1). To do this, recently developed "low-k" dielectric materials are increasingly organic and contain porosities. These materials have the disadvantage of being much more difficult to integrate than inorganic materials, such as $SiO_2$.

In addition, if the insulating layer is based on a low dielectric constant or "low-k" material, it is generally deposited in successive layers separated by an etching boundary layer, for example based on $SiO_2$ or $Si_3N_4$. The use of the dielectric material having a low dielectric constant therefore generally complicates the method for producing the insulating layer performed subsequently.

As long as the insulating layer was inorganic, based on materials such as $SiO_2$, the steps of masking and etching are not problematic. The production of interconnection structures including an insulating layer based on a low dielectric constant material is much more complex.

First, with an insulating layer based on an organic low dielectric constant material, the masking step requires the use of a masking layer, opposite the "low-k" material, that is more selective than a simple photosensitive resin layer. The masking layer is therefore generally a hard mask layer made of $SiO_2$, SiC or $Si_3N_4$, for example, coupled with photosensitive resin layer comprising at least one opening.

Then, once the holes have been made, the removal of the masking layer without altering the insulating layer is a very delicate process. The process for removing the masking layer is called "stripping". This method uses stripping or cleaning solutions or an $O_2$ plasma, which have a tendency to modify the chemical nature of the insulating layer, by consuming the carbon contained in the organic and porous dielectric material forming the insulating layer. This consequently weakens the structure of the insulating layer. The lower the dielectric constant of the organic and porous dielectric materials (desired criterion), the more fragile the structure of the initial insulating layer will be.

In addition, stripping or cleaning solutions or $O_2$ plasma have a tendency to penetrate any porosities in the dielectric material, thus considerably modifying the nature and can cause "poisoning" of layers deposited subsequently.

One method for carrying out the stripping processes of the masking layer while reducing the alteration of the "low-k" insulating layer is described in document [1] referenced at the end of this description. It involves using a hydrogen-based plasma, for example $N_2/H_2$ in the place of the conventional stripping solutions or $O_2$ plasma. Nevertheless, this method only partially reduces the alteration of the insulating layer.

In addition, as already indicated above, the constitution of the interconnection structures, in particular Damascene structures, includes a deposition step, for example using the CVD (chemical vapour deposition) method or electrolysis of a metal material. The metal material then tends to diffuse through the walls of the holes and penetrate the insulating layer. When the interconnection structure is used, leakage currents can then appear due to the presence of the metal material in the insulating layer.

To overcome this problem, a known method consists of providing a "diffusion barrier" layer based, for example, on TiN or TaN on the walls of the vertical orifices and the trenches. This diffusion barrier layer is produced, for example, using the chemical vapour deposition (CVD) method, or, for example, by atomic layer chemical vapour deposition (ALCVD) owing to the use of precursor gases. However, these precursor gases also tend to diffuse into the porosities of the dielectric material having a low dielectric constant.

Document [2], referenced at the end of this description, shows that the use of a hydrogen-based plasma, for example $N_2/H_2$, in the step of stripping the masking resin, prior to the step of deposition of the diffusion barrier layer, enables the impermeability of the walls of the holes to be improved, in addition to removing the masking layer. Nevertheless, the method as a whole remains complex and difficult to implement.

To improve the performance of integrated circuits, it is also possible to produce interconnection structures equipped with a conductive element or a metal connection element having a high aspect ratio. This characteristic adds an additional problem to the production methods and is often incompatible with the formation of interconnections equipped with a dielectric material having the lowest possible dielectric constant.

Therefore, the problem is more generally that of providing an improved damascene-type interconnection structure, as well as a new method for producing damascene-type interconnection structures.

DISCLOSURE OF THE INVENTION

This invention relates to a method for producing an interconnection structure including:

a) the production on a microelectronic device of an insulating layer based on a first dielectric material of density $d_1$ and of dielectric constant $k_1$, and at least one hole in said insulating layer, b) the selective production, with regard to the microelectronic device, of a support layer on the hole walls, c) the deposition, in the hole, of a conductive material.

The support layer holds the metal connection element and makes it possible to form interconnections equipped with metal connection elements having a high aspect ratio. The latter is performed in step (b), so as to coat the side surfaces of the metal element, without disturbing the electrical connection between said element and the microelectronic device.

The support layer is preferably made of a material having a density $d_3$ greater than the density $d_1$ of the material forming the insulating layer. It can be based on a material having a dielectric constant $k_3 \geq 4.2$, therefore of the "high-k"-type, so that it does not reduce the conductivity of the interconnection structure. The support layer can also be based on a refractory material, so as to resist high temperatures in subsequent steps of the method.

This support layer can, for example, be based on a metal oxide or a ceramic material. It can also be based on a dielectric material selected from the following materials: $HfO_2$, $ZrO_2$, $TiO_2$, $Y_2O_3$, $CrO_2$.

It can also be based on a material selected from the following: $In_2O_3$, $SnO_2$, $Ga_2O_3$, $CdTe$, $HgTe$, $AlN$.

The support layer is preferably thin and uniform. It can be made using an atomic layer chemical vapour deposition method (ALCVD) which can make it possible to obtain a very uniform and thin support layer, for example, between 6 and 8 nanometers.

According to a first embodiment, step (b) can include:
 the deposition of the support layer on the walls and at the base of the hole,
 the removal of the support layer at the base of the hole.

According to a second embodiment, step (b) can advantageously include the selective deposition, with regard to the microelectronic device, of the support layer on the walls of the hole.

This invention also proposes a method for producing an interconnection structure including at least one insulating layer based on a low dielectric constant material that is more simple to produce than those of the prior art. In addition, the invention leads to the production of interconnection structures of higher quality than those obtained using the methods of the prior art, in particular by enabling the low dielectric constant material to remain intact after its formation. According to a specific embodiment, the method can also include: at least a partial removal of the first dielectric material and its replacement with a second dielectric material having a dielectric constant $k_2 \leq k_1$.

Thus, the metal connection element is produced in or through an insulating layer based on a first dielectric material having a dielectric constant $k_1$, for example, of which the integration is known, and not involving a complex etching process. This first dielectric material can be inorganic, such as $SiO_2$, for example, deposited by plasma, and easy to work with. Then, once the connection element has been made, all or part of the first dielectric material is withdrawn so that it can be replaced with a second dielectric material, having a low dielectric constant $k_2$, generally with better insulation properties than the former, but generally also more complex to work with. Thus, the production of low dielectric constant interconnection structures is first simplified. Then, the quality of these structures is improved, in particular by reinforcing the solidity of the insulating layer. Indeed, the dielectric material of low constant $k_2$, constituting the final insulating layer, is added at the end of the production process; it has therefore been preserved from the masking, etching and stripping steps capable of altering it.

The support layer makes it possible to hold the metal connection element when the first dielectric material is removed, and then to support the metal connection elements having high aspect ratios.

The support layer also makes it possible to protect the metal connection element from any chemical attack such as, for example, a hydrofluoric acid attack, during removal of the first dielectric material. The support layer is preferably insensitive to the process of removing the first dielectric material, for example, performed by etching or chemical attack with hydrofluoric acid.

According to an embodiment of the method, the first dielectric material can be inorganic. It can also be mineral and include one of the following materials: $SiO_2$, fluorinated silicon oxide (FSG), undoped silicon oxide (USG), plasma-deposited silicon oxide, phosphorus-doped silicon oxide (PSG) or boron-doped silicon oxide (BPSG).

$k_1$ can be greater than or equal to 3 or 3.5 or 4.2. Thus, the first dielectric material can be selected for being simple to integrate, rather than for its insulating properties. Inorganic materials such as $SiO_2$, which are relatively easy to work with, generally have a dielectric constant greater than or equal to 3.

The second dielectric material can include a polymer or can be based on a polymer such as a poly(silsesquioxane), such as hydrogen silsesquioxane (HSQ) or an aromatic polymer such as SiLK®, FLARE® or VELOX®. It can also be organic or based on an organic polymer such as polyarylether (PAE) or benzocyclobutene (BCB).

According to an alternative, the second dielectric material can be inorganic, for example based on a nanoporous silicon oxide-based material or a fluorinated silicon oxide.

It can have porosities. Thus, it can be, for example, based on a nanoporous silicon oxide or a porous polymer.

The dielectric constant $k_2$ can be chosen to be below 4.2 or 3.5 or 3, in which case it is a "low-k"-type material having good insulating properties. The dielectric constant $k_2$ can even reach a value below 2 depending to its nature (organic or inorganic, porous or not, etc.) and the deposition method used.

The metal connection element can include a metal or a metal alloy based on a material selected from the following materials: copper, tungsten, aluminium, silver, nickel, gold or zinc.

As regard the removal of the first dielectric material, it can be performed by chemical etching using a hydrofluoric (HF) acid-based solution with a given attack speed and concentration. Depending on the etching time, the first dielectric material can be removed partially or completely.

The replacement of the first dielectric material with the second dielectric material can include the deposition of the second dielectric material using the chemical vapour deposition method, spin coating or plasma-enhanced chemical vapour deposition.

This invention also relates to an interconnection structure comprising:
- at least one insulating layer based on a dielectric material covering said microelectronic device,
- at least one metal connection element formed in said insulating layer and in contact with said microelectronic device,
- and at least one support layer based on a dielectric material, for example having a dielectric constant $k_3$ greater than or equal to 4.2, at least partially coating the metal connection element.

According to a specific embodiment, the insulating layer can be based on a dielectric material having a low dielectric constant $k_2$ below 4.2.

The support layer can include a ceramic material or a metal oxide, or a material from among the following: $HfO_2$, $ZrO_2$, $TiO_2$, $Y_2O_3$, $CrO_2$.

According to a specific feature, said interconnection structure according to the invention can be included in a microelectro-mechanical system (MEMS).

BRIEF DESCRIPTION OF THE DRAWINGS

This invention can be better understood from the description of an embodiment example given solely by way of indication, which is in no way limiting, with reference to the appended drawings wherein.

The various parts shown in the figures are not necessarily represented on a uniform scale, thereby making the figures easier to read.

DETAILED DESCRIPTION OF PARTICULAR EMBODIMENTS

An example of a method for producing a damascene-type interconnection structure will now be described.

Figure 1A:
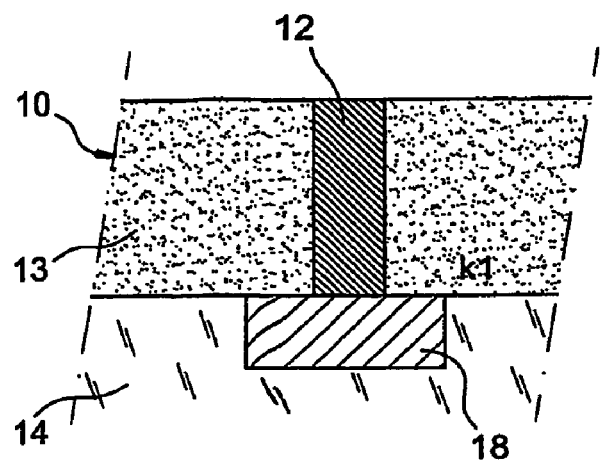
FIGS. 1A-1B show steps of a method for producing a damascene-type interconnection structure.

As shown in FIG. 1A, starting with an interconnection structure comprising at least one insulating layer 10 based on a dielectric material 13 having a dielectric constant $k_1$, for example greater than 3, 3.5 or 4.2, and a connection element 12 formed in, or through, said insulating layer 10, the dielectric material 13 is at least partially removed from the insulating layer 10. This removal is performed, for example, by chemical etching based on hydrofluoric HF acid, for example having a mass concentration below 50%, and for a duration on the order of 1 to 2 minutes, for example. This operation can be performed, for example, in a deoxygenated bath obtained by bubbling nitrogen so as to prevent corrosion of the metal interconnection element 12.

Then, the removed material 13 is replaced with a second dielectric material 16 having a dielectric constant $k_2$ lower than or equal to $k_1$, for example, by PECVD or by spin coating. This second material 16 is preferably "low-k", with the constant $k_2$ being, for example, below 4.2, 3.5 or 3.

This second dielectric material 16 can be based on a polymer such as a polyarylether (PAE), or an aromatic polymer such as SiLK®, FLARE® or VELOX®. It can be organic. It can be based on benzocyclobutene (BCB), polytetrafluoroethylene (PTFE), a xerogel including a molecule of general formula R'—[Si(OMe)3] n. It can also be inorganic, such as a fluorinated silicon oxide. It can also include porosities, such as, for example, a nanoporous silicon oxide.

Figure 1B:
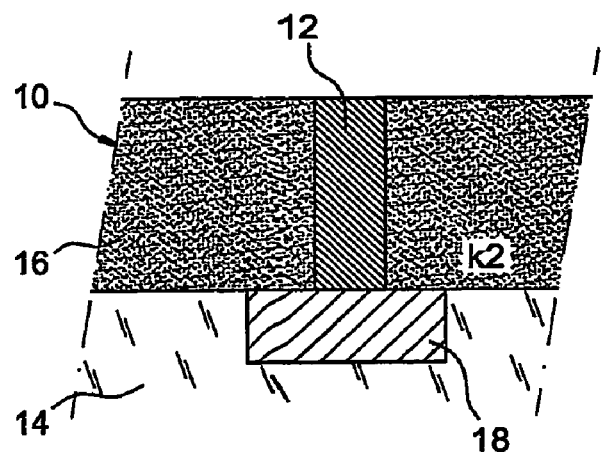

As shown in FIG. 1B, the final structure therefore includes a metal connection element 12 integrated in an insulating layer 10 based on a dielectric material 16 having a low dielectric constant. It enables the connection of the metal connection element 12 with at least one conductive area 18 of a microelectronic device 14.

One aspect of the invention will be described in reference to FIGS. 2A to 2C.

Figure 2A:
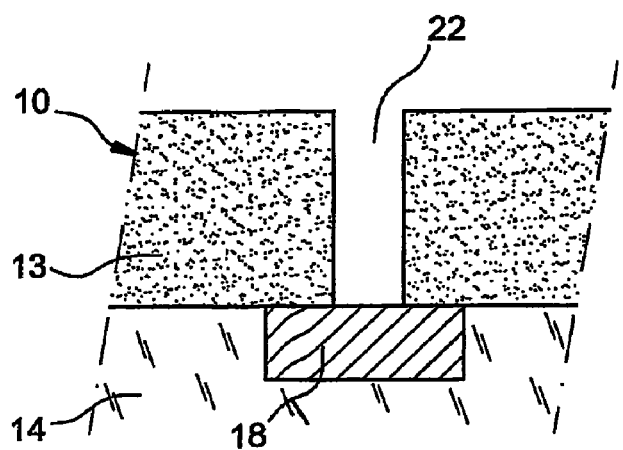
FIGS. 2A to 2C and 3 respectively show the steps of an example of a method according to the invention, and an alternative of a step of this example method.

FIG. 2A shows an insulating layer 10 comprising one or more holes 22, based on a dielectric material 13 of density $d_1$, resting on a microelectronic device or support 14 before formation of at least one contact element. The holes 22 expose conductive areas 18 of the support or device 14. The material of the insulating layer 10 has any dielectric constant $k_1$, for example, greater than 3, 3.5 or 4.2.

Before the formation of the contact element or the metal connection element, a so-called support layer 20 is formed, with a thickness, for example, between 3 and 10 nanometers and resting on the insulating layer 10 and on the walls of the holes 22, without covering the base of said holes. This thickness is preferably constant and low so as not to affect performance with regard to the overall dielectric constant of the interconnection structure.

Figure 2B:
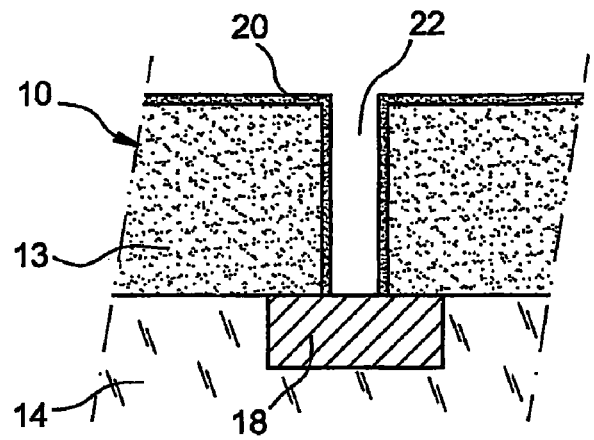
Figure 2C:
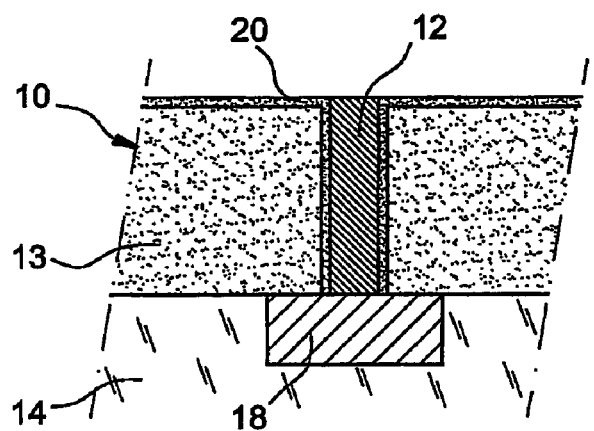

The support layer 20 can be produced by selective deposition on the support or microelectronic device 14, so as to cover only the insulating layer 10 and the walls of the holes 22, without covering the base of said holes (FIG. 2B). This deposition can be performed, for example, using an atomic layer chemical vapour deposition (ALCVD or ALD) method.

The support layer can be based on a material having a density $d_3$ greater than the density $d_1$ of the dielectric material 13 and preferably insensitive to chemical attacks such as hydrofluoric acid etching. It can be based, for example, on a dielectric material with a high dielectric constant $k_3$, for example, above 4.2. The material forming the support layer 20 can be a ceramic material, preferably of high mechanical strength, or a refractory material, or a metal oxide, or a material selected from the following: $HfO_2$, $ZrO_2$, $TiO_2$, $CrO_2$, $Y_2O_3$, $AlN$, $In_2O_3$, $SnO_2$, $Ga_2O_3$, $CdTe$ or $HgTe$, which are generally insensitive to hydrofluoric acid etching.

The ALD deposition of the material forming the support layer 20, for example based on $HfO_2$, can be integrated on the entire surface of the insulating layer 10. This deposition can be preceded by a hole 22 cleaning step, for example using a solution based on ozone, hydrofluoric acid and hydrochloric acid. Said solution can also prepare the deposition of the support layer 20. Indeed, it enables nucleation sites comprising the structure —OH to be created so as to facilitate adherence of the support layer 20.

The support layer 20 can serve to hold the metal connection element formed in the holes 22 of the insulating layer 10, during an operation, such as that mentioned above (in association with FIGS. 1A and 1B), the removal of at least one portion of the dielectric material 13.

After formation of the support layer, a metal connection element 12 is formed, for example by physical vapour deposition (PVD) of a conductive material. This produces a connection element 12, as shown in FIG. 2C, which can itself be followed by a step of at least partial removal of the layer 10 and replacement with a dielectric material of constant $k_2$ as explained above.

Figure 3:
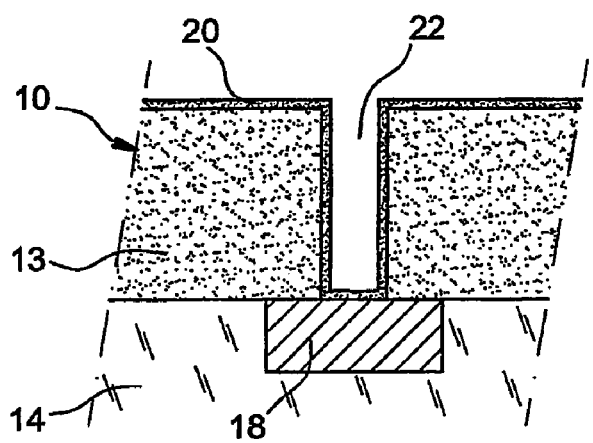

According to an alternative of the method described above, the support layer 20 can be made by deposition on the insulating layer 10, on the walls of the holes 22 and at the base of the latter (FIG. 3). In this case, the portion of the support layer 10 covering the base of the holes 22 is then etched before the step (previously described in association with FIG. 2C) of forming the connection element 12.

Other aspects of a method according to the invention will now be described in association with FIGS. 4A to 4H, based on the formation of a structure as described above in association with FIG. 1A.

First, in a first step, a protective layer 102, for example based on a material such as SiC, $Si_3N_4$, is deposited on at least one conductive area 101, for example made of copper, flush with the surface of a microelectronic device 100. The microelectronic device 100 can be all or part of a chip, a substrate, an integrated circuit or a MEMS (micro-electro-mechanical system). The conductive area 101 can, for example, be a line or a metal pad, for example, made of copper.

The protective layer 102 serves as a wall for preserving the conductive area 101, for example, during the etching steps performed subsequently.

Figure 4A:
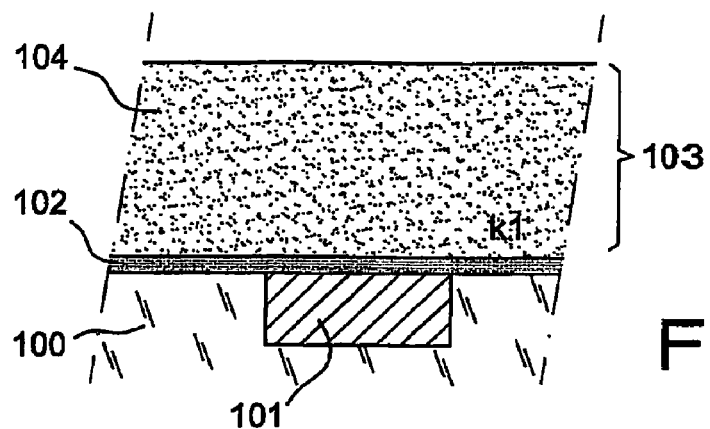
FIGS. 4A-4H show different steps of a method for producing a low dielectric constant interconnection structure according to the invention.
Figure 4B:
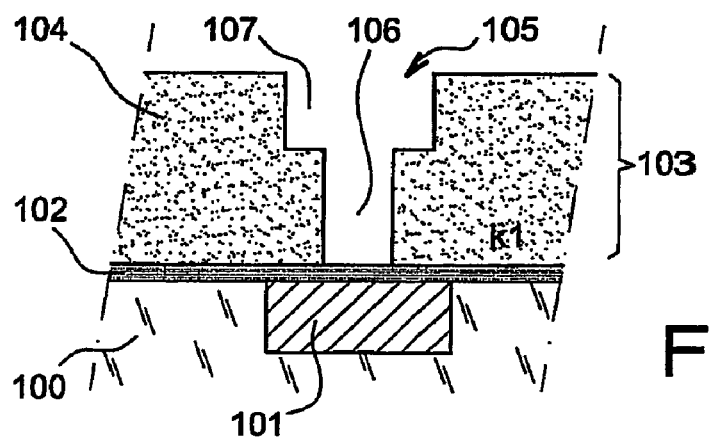

Next, an insulating layer 103 having a thickness between for example 100 nanometers and 1 micrometer, or for example from 1 to 100 micrometers, is deposited on the protective layer 102. The insulating layer 103 is produced by at least one deposition, for example using a chemical vapour deposition (CVD) method, of a dielectric material 104 of dielectric constant $k_1$. The dielectric material 104 can be inorganic, for example, a so-called "high-k" material. It can also have a dielectric constant $k_1$, greater than 3, 3.5 or between 3 and 3.5 or 3 and 4.2. The dielectric material 104 can, for example, be $SiO_2$, or an undoped silicon oxide (USG), a fluorinated silicon oxide (FSG), or a plasma-deposited silicon oxide (FIG. 4A).

Then (FIG. 4B), one or more holes 105 are formed in the insulating layer 103 coating the protective layer 102 and in the alignment of the conductive area 101. The holes 105 comprise at least one vertical orifice 106, for example having a depth between 100 and 1000 nanometers, or from 10 to 1000 micrometers, exposing the protective layer 102. A horizontal trench 107 can also be formed in the extension of the vertical orifice. It is generally wider than the vertical orifice. Thus holes are created, each comprising a first portion in the form of one or more trenches, which correspond to the future location of horizontal conductive lines, and a second portion in the form of one or more vertical orifices, which correspond to the future location of vertical conductive lines.

The holes are, for example, produced by a method that includes steps consisting of first performing photolithography using a photosensitive resin layer, for example, based on a polyimide that is insolated, then developed, so as to form a photosensitive resin layer comprising at least one opening. Next, a process of anisotropic etching of the insulating layer is performed through the photosensitive resin layer comprising at least one opening. Once the etching has been performed, the photosensitive resin layer is removed by the stripping method, for example, using an $O_2/H_2$ plasma.

Then, it is possible to perform, on the insulating layer by atomic layer chemical vapour deposition (ALCVD or ALD), the deposition of a so-called "support layer" 108 having a thickness, for example, between 3 and 10 nanometers, as already described in reference to FIG. 2B. The support layer 108 can serve in particular to hold a metal connection element subsequently formed in the holes 105.

Figure 4C:
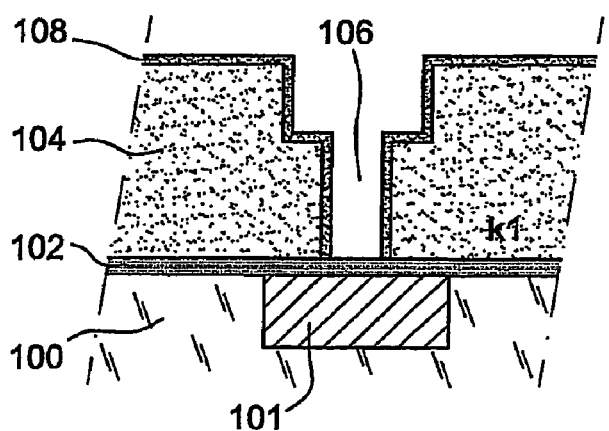
Figure 4D:
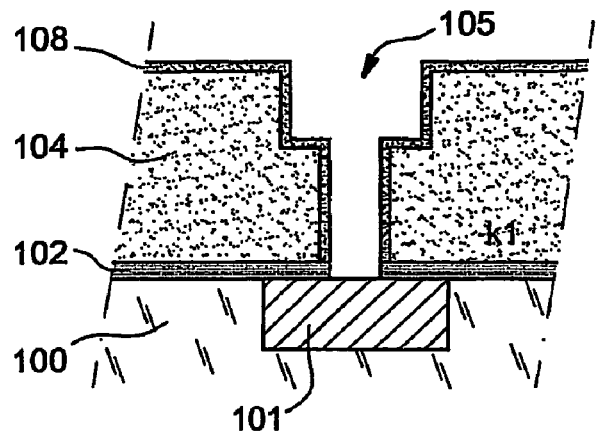

The ALD deposition of the material forming the support layer 108, for example based on $HfO_2$, is preferably consistent over the entire surface of the insulating layer 103. However, the support layer can also be produced selectively on the protective layer 102 exposed by the vertical orifice 106. Thus, the support layer 108 can be formed, for example, by a selective deposition on the protective layer 120 so as to cover the insulating layer 103 without covering the base of the holes 105 (FIG. 4c). The support layer is preferably produced with a uniform thickness.

After the production of the support layer 108, the protective layer 102 at the base of the holes 105 (FIG. 4D) is selectively etched using a conventional method, without reaching the support layer 108.

A deposition or electrolysis of a metal material 109 based, for example, on copper, tungsten, aluminium, or silver, nickel, zinc or gold, etc., is then performed so as to fill the holes 105. The deposition can be performed by a method such as physical vapour deposition (PVD). The support layer 108 covering the walls of the holes 105 can also serve as a metal diffusion barrier. It then protects the insulating layer 103 from the diffusion of the metal material 109 during and after the electrolysis or the deposition of the metal material.

Figure 4E:
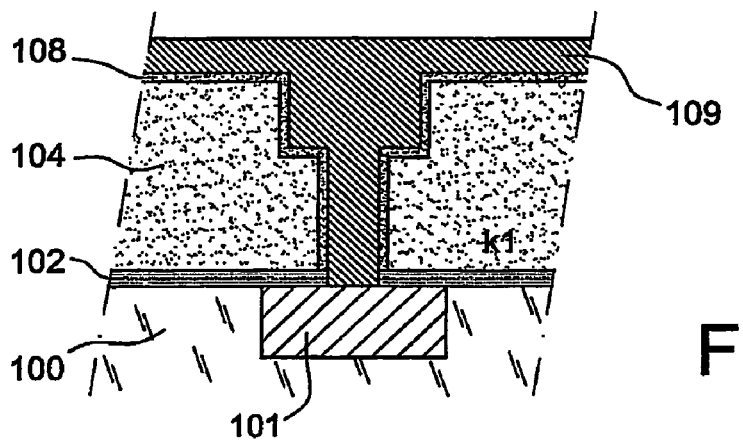

The deposition or electrolysis of the metal material 109 generally fills the holes to the surface and entirely covers the support layer 108 resting on the insulating layer 104 (FIG. 4E).

Then, a step of polishing of the deposited metal material 109 and at least some of the support layer 108 is performed until the height of the opening of the holes is reached. The polishing can be performed, for example, by chemical-mechanical polishing (CMP).

Figure 4F:
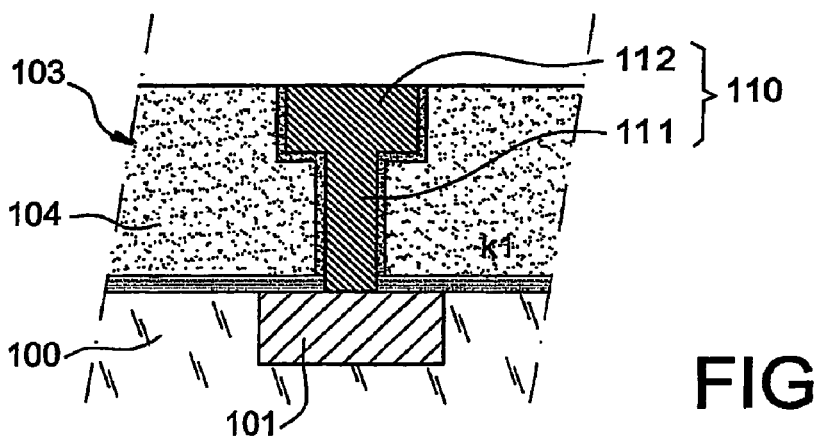

The vertical orifice of the filled holes forms at least one vertical conductive line 111. If there is also a horizontal trench, once filled, it forms at least one horizontal conductive line 112. The conductive lines together form a metal connection element 110 that interconnects, for example, with the conductive area 101 of the microelectronic device (FIG. 4F). This metal connection element can have a high aspect ratio.

An interconnection structure comprising at least one insulating layer 103 based on a dielectric material 104 having a dielectric constant $k_1$, and at least one metal connection element 110 has thus been produced.

Figure 4G:
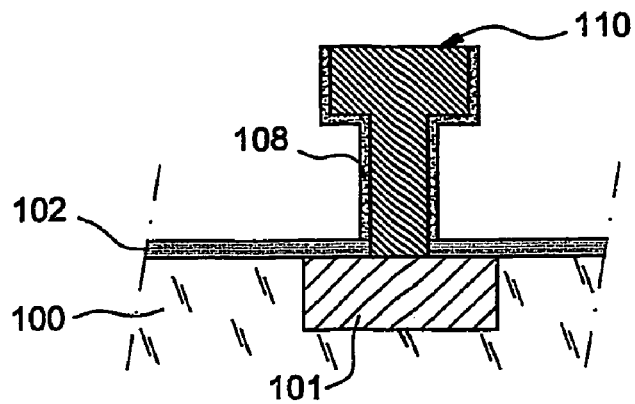

Then, as shown in FIG. 4G, and as already explained in reference to FIG. 1A, the dielectric material 104 of dielectric constant $k_1$, such as $SiO_2$, is at least partially removed using, for example, a chemical etching process based on hydrofluoric (HF) acid. This operation can be performed, for example, in a deoxygenated bath obtained by bubbling nitrogen so as to prevent corrosion of the metal connection element. The metal connection element is also protected from HF acid attack by the support layer 108, which is preferably insensitive to such an attack. It also serves to hold the connection element 110 during and after the removal of the dielectric material of dielectric constant $k_1$.

Figure 4H:
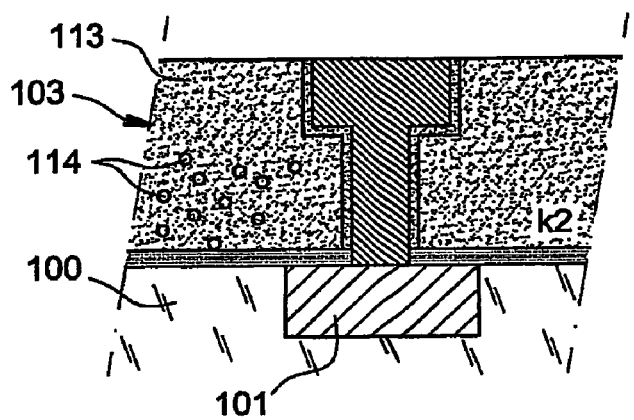

Then, the dielectric material of dielectric constant $k_1$, is replaced with a second dielectric material 113 of dielectric constant $k_2$ lower than or equal to $k_1$ (FIG. 4H). The second dielectric material 113 is deposited, for example, by plasma-enhanced chemical vapour deposition (PECVD), or by spin coating. It is, for example, "low-k" or "low dielectric constant" so that $k_2$ is, for example, lower than 4.2, 3.5 or 3. The second dielectric material can be based on a polymer such as a polyarylether (PAE), or an aromatic polymer such as SiLK®, FLARE® or VELOX®. It can be organic. It can be based on benzocyclobutene (BCB), polytetrafluoroetheylene (PTFE), a xerogel including a molecule having the general form R'—[Si(OMe)3] n. The second dielectric material 113 of dielectric constant $k_2$ can also be, for example, inorganic, such as a fluorinated silicon oxide. It can also include porosities, such as a nanoporous silicon oxide, for example.

According to an alternative of the method, the second dielectric material 113 can be deposited by spin coating.

Thus, an interconnection structure including or comprising at least one insulating layer 103 based on a dielectric material 113 having a low dielectric constant $k_2$, at least one metal connection element 110 formed in said insulating layer 103, and, optionally, at least one support layer 108 is formed.

Figure 5:
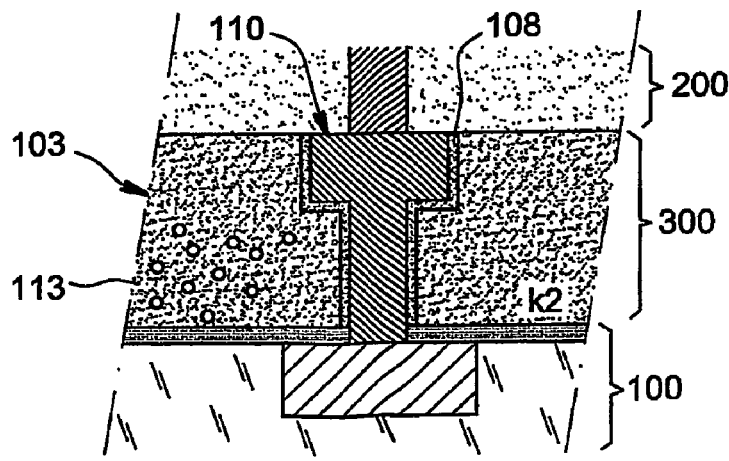
FIG. 5 shows a microelectronic system according to the invention.

FIG. 5 shows a system including a first microelectronic device 100 and a second microelectronic device 200 mutually connected by means of an interconnection structure 300 according to the invention and comprising at least one insulating layer 103 based on a dielectric material 113 having a low dielectric constant $k_2$, for example, below 4.2, at least one metal connection element 110 formed in said insulating layer 103, and at least one support layer 108 coating the metal element.

The device 100 can be a chip, an integrated circuit or a micro-electro-mechanical system, or any type of electronic circuit. The same applies to the device 200.

CITED DOCUMENTS

[1]: Ultra low dielectric constant low density material for Cu Damascene"; Y.Y. Cheng, L. C. Chao, S. M. Jang, C. H. Yu, M. S. Liang"; Taiwan semi-conductor company; © 2000 IEEE.

[2]: "Preparation of Damascene trench sidewalls in CVD nano-porous ultra low k (k=2.2) films for compatibility with MOCVD diffusion barriers"; H. Donohue, J.-C. Yeoh, S. Burgess. K. Buchanan; Trikon technology; Advance metallization conference, San Diego, 1 to 3 Oct. 2002".

The invention claimed is:

1. A method for producing an interconnection structure comprising:
    a) producing, on a microelectronic device, an insulating layer based on a first dielectric material of density $d_1$ and of dielectric constant $k_1$, and at least one hole in said insulating layer;
    b) selectively producing, with respect to the microelectronic device, on walls of said hole, a support layer including a dielectric material having a dielectric constant $k_3 \geq 4.2$;
    c) depositing, in said hole, a conductive material; and
    d) removing said insulating layer based on said first dielectric material and replacing thereof with a second dielectric material having a dielectric constant $k_2 \leq k_1$, wherein the second dielectric material includes porosities.

2. The method for producing an interconnection structure according to claim 1, wherein the selectively producing (b) includes selectively depositing, with regard to the microelectronic device, the support layer on the walls of the hole.

3. The method according to claim 1, wherein said removing includes removing said first dielectric material by chemical etching, said chemical etching being selective relative to said support layer.

4. The method according to claim 1, wherein the support layer includes a material of density $d_3$ greater than $d_1$.

5. The method according to claim 1, wherein the support layer includes a material selected from: $HfO_2$, $ZrO_2$, $TiO_2$, $CrO_2$, $Y_2O_3$, $AlN$, $In_2O_3$, $SnO_2$, $Ga_2O_3$, $CdTe$ or $HgTe$.

6. The method according to claim 1, wherein the first dielectric material includes one of: $SiO_2$, fluorinated silicon oxide (FSG), undoped silicon oxide (USG), plasma-deposited silicon oxide, phosphorus-doped silicon oxide (PSG) or boron-doped silicon oxide (BPSG).

7. The method according to claim 1, wherein $k_1$ is greater than or equal to 3.

8. The method according to claim 1, wherein the conductive material includes a metal material selected from: copper, tungsten, aluminium, silver, nickel, zinc or gold.

9. The method according to claim 1, wherein the selectively producing includes producing the support layer by atomic layer chemical vapor deposition (ALCVD).

10. The method according to claim 1, wherein said removing includes performing selective etching with HF to remove said insulating layer based on said first dielectric material, and the support layer includes a material resistant to HF etching.

11. A method for producing an interconnection structure, comprising:
    producing, on a microelectronic device covered by a protective layer, an insulating layer based on a first dielectric material of density $d_1$ and of dielectric constant $k_1$, and at least one hole in said insulating layer;
    selectively depositing, with respect to said protective layer covering said microelectronic device, on walls of said hole, a support layer including a dielectric material having a dielectric constant $k_3 \geq 4.2$;
    etching a portion of the protective layer situated in said hole;
    depositing, in the hole, a conductive material; and
    removing said insulating layer based on said first dielectric material and replacing thereof with a second dielectric material having a dielectric constant $k_2 \leq k_1$, wherein the second dielectric material includes porosities.

* * * * *